United States Patent [19]

Sielaff et al.

[11] Patent Number: 4,861,524
[45] Date of Patent: Aug. 29, 1989

[54] APPARATUS FOR PRODUCING A GAS MIXTURE BY THE SATURATION METHOD

[75] Inventors: Günter Sielaff, Bensheim; Frank Joseph, Gernsheim; Norbert Harder, Aschaffenburg, all of Fed. Rep. of Germany

[73] Assignee: Merck Patent Gesellschaft Mit Beschrankter Haftung, Darmstadt, Fed. Rep. of Germany

[21] Appl. No.: 170,222

[22] Filed: Mar. 18, 1988

[30] Foreign Application Priority Data

Mar. 19, 1987 [DE] Fed. Rep. of Germany ....... 3708967

[51] Int. Cl.⁴ ............................................... B01F 3/04
[52] U.S. Cl. .................................... 261/130; 261/122; 261/153; 261/157; 261/121.1; 220/470
[58] Field of Search ............... 261/130, 122, 153, 157, 261/121.1; 220/470

[56] References Cited

U.S. PATENT DOCUMENTS

| | | | |
|---|---|---|---|
| 2,650,808 | 9/1953 | Cohen et al. | 261/153 |
| 3,074,700 | 1/1963 | Buttner, Sr. et al. | 261/157 |
| 3,360,003 | 12/1967 | Parker | 261/70 |
| 3,618,905 | 11/1971 | Primus | 261/157 |
| 3,875,267 | 4/1975 | Seki et al. | 261/70 |
| 4,072,243 | 2/1978 | Conant et al. | 220/470 |
| 4,276,243 | 6/1981 | Partus | 261/121.1 |
| 4,353,345 | 10/1982 | Ebihara | 261/70 |
| 4,545,801 | 10/1985 | Miyajiri et al. | 261/121.1 |
| 4,563,312 | 1/1986 | Takimoto et al. | 261/121.1 |
| 4,582,480 | 4/1986 | Lynch et al. | 261/22 |

*Primary Examiner*—Tim Miles
*Attorney, Agent, or Firm*—Millen, White & Zelano

[57] ABSTRACT

To produce a gas mixture by the saturation method, liquid is fed from a stock vessel to a separate reaction vessel. A carrier gas enters through a dip tube into the liquid present in the reaction vessel and is saturated by the liquid. The reaction vessel consists, for example, of quartz and is disposed in a metal block connected to a temperature control system. A level sensor fitted to the reaction vessel controls a flow regulation instrument on the liquid feed. The volume of the reaction vessel is substantially smaller than the volume of the stock vessel. Only the temperature of the reaction vessel is controlled. Temperature control of the stock vessel is not required. The saturation process in the reaction vessel takes place uniformly, independently of the temperature and the level in the stock vessel.

14 Claims, 1 Drawing Sheet

APPARATUS FOR PRODUCING A GAS MIXTURE BY THE SATURATION METHOD

BACKGROUND OF THE INVENTION

The invention relates to an apparatus for producing a gas mixture by the saturation method, wherein a stock vessel is provided for storing a liquid to be mixed with a carrier gas and a dip tube is provided for introducing the carrier gas into the liquid.

Such devices are used for producing a continuous volumetric flow of a defined mixture of a carrier gas and an additive. The saturation method according to current practice (VDI guideline 3490, sheet 13) involves passing the carrier gas through the liquid (condensed phase of the additive) maintained at a defined temperature and thus saturating it. The volume content of the additive is determined by the partial pressure of the additive, relative to the total pressure of the gas mixture at the particular temperature.

These prior art devices are used as sources of substances for special processes in semiconductor manufacture, such as, for example, for chemical vapor deposition processes, doping processes and diffusion processes, but additionally, also for deposition processes for the production of optical fibers.

The particular difficulties of these methods consist above all in maintaining an accurately constant concentration of the additive in the gas mixture. In the production of optical gradient fibers, it is also necessary to run with a precisely predetermined concentration profile.

It is a common feature of all the devices of the generic type thus far described that the saturation of the carrier gas take place in the stock vessel containing the liquid. The carrier gas is introduced through a dip tube into the liquid and bubbles upwards while being saturated with the additive from the liquid phase. The resulting degree of saturation depends on the path length covered by the gas bubbles through the liquid and, therefore, changes when the level in the stock vessel decreases.

In order to eliminate temperature effects, the entire stock vessel must be maintained at the desired temperature by means of a temperature control system. Therefore, after an exchange of the stock vessel, which is also called feed vessel, the device is ready for operation only after a prolonged period, when the entire liquid stock has reached the predetermined temperature. The desired change in the liquid temperature can therefore usually be set only after a wait of several hours.

These known devices for producing a gas mixture by the saturation process are also called "bubblers" because of the gas bubbles rising from the dip tube or fritted tube; the volumetric flow is regulated by controlling the mass flow the carrier gas.

SUMMARY OF THE INVENTION

It is the object of the invention to provide a device of the aforedescribed type which allows the quantity of added substance and hence the degree of saturation of the gas mixture produced to be kept precisely constant under any operating conditions and by means of which a relatively rapid and controlled change in concentration can also be effected.

According to the invention, this object is achieved when the stock vessel is connected via a liquid line to a separate reaction vessel to which the carrier gas is fed via the dip tube, when the volume of the reaction vessel is substantially smaller than the volume of the stock vessel, when the reaction vessel has a contactless level sensor which controls a flow regulation instrument in the liquid line leading to the reaction vessel, and when the reaction vessel is fitted with a temperature control system.

In contrast to known devices, the saturation of the carrier gas takes place, according to the invention, in the separate reaction vessel and not in the stock vessel. The reaction vessel can therefore have a substantially smaller volume than the stock vessel, so that substantially improved control of engineering behavior with respect to time is obtained. The reaction vessel remains at its predetermined operating temperature even after a transfer of liquid from the stock vessel and is therefore immediately ready for operation. The small volume of the reaction vessel allows a rapid change in temperature if this is necessary, as for example when setting up a concentration gradient. Temperature change of the reaction vessel can therefore be achieved within a few minutes, whereas several hours were necessary for this purpose in known devices.

The quantity of liquid present in the stock vessel can be exhausted down to a very small residue without adversely affecting the saturation process which takes place in the separate reaction vessel. Compared with this, a residue of about 20% of the original quantity of liquid had to remain in the bubbler vessel in conventional devices, since it was otherwise impossible to obtain adequate saturation of the carrier gas leaving the dip tube.

Since the liquid level in the separate reaction vessel is kept constant by means of the level sensor and the flow regulation instrument, independently of the quantity of liquid present at the time in the stock vessel, the saturation of the carrier gas and hence—if the mass flow of the carrier gas stream is controlled—the content by volume of the additive in the carrier gas can be kept constant with high accuracy. This is of particular importance, for example, if the additive is a doping agent used in semiconductor manufacture.

In order to exclude the possibility of a contamination of the additive, for example a doping agent, by a chemical reaction of the vessel wall with hydrolysis products caused by traces of water in the carrier gas, it suffices to make the reaction vessel of quartz. The stock vessel, however, can consist of glass, since no carrier gas flows through the liquid in the stock vessel. It is not necessary to provide a temperature measurement pocket in the stock vessel, in which case it would not be possible to exclude the risk of breakage with sufficient certainty.

The stock vessel is operated in a virtually unpressurized state, so that improved safety is provided. The glass container of the stock vessel can be plastic-lined, since no temperature control of the stock vessel is necessary. The result is that aggressive liquid cannot escape even if the glass breaks.

Preferably, the reaction vessel consisting of quartz is disposed in a metal block connected to a temperature control system, in order to ensure a uniform temperature distribution. In order to adjust the liquid rate coming from the stock vessel which is not temperature-controlled to the set temperature of the reaction vessel, the liquid line preferably passes through one or more holes in the metal block to the reaction vessel.

Further advantageous embodiments of the inventive concept are the subject of further subclaims.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein.

DESCRIPTION OF PREFERRED EMBODIMENT

Figure 1:
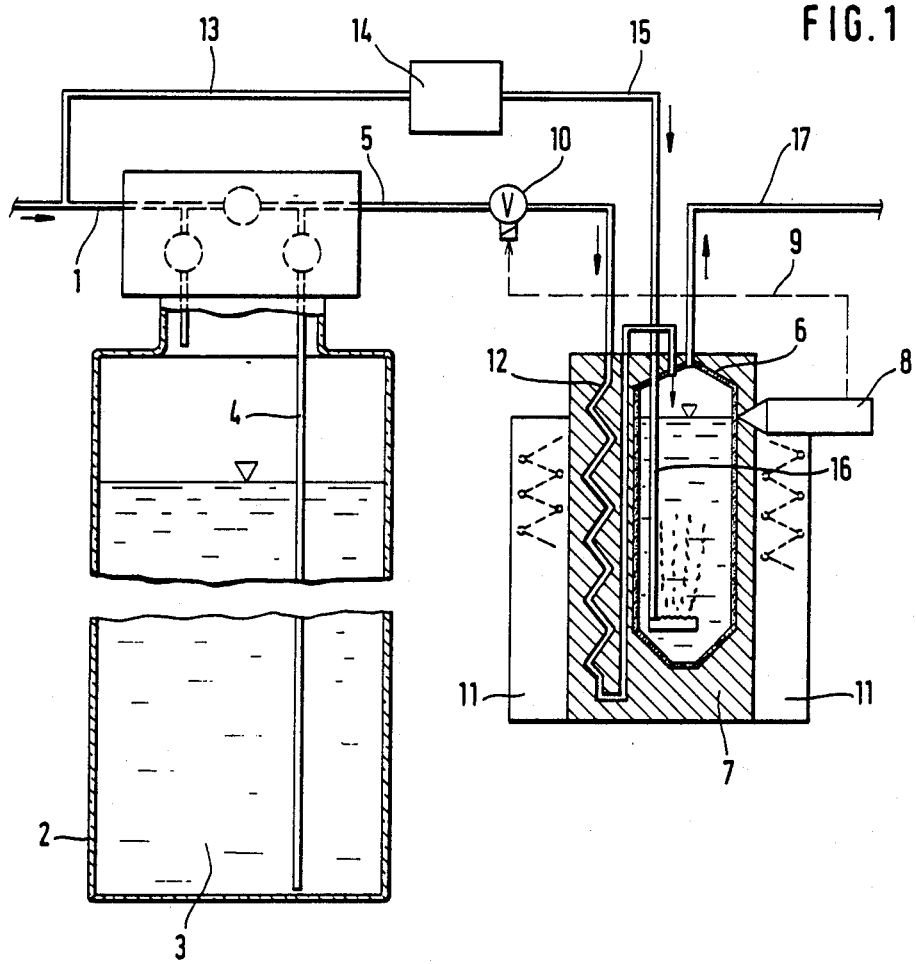
FIG. 1 shows a device substantially in vertical section for producing a gas mixture by the saturation method, having a stock vessel and a separate reaction vessel.

A carrier gas, for example nitrogen, is fed through a gas feed line 1 to a stock vessel 2. The stock vessel 2 is made of glass and contains a liquid 3 which is to be admixed, in the gas phase, with the carrier gas. The carrier gas takes up the space located above the liquid in the stock vessel 2 and forces the liquid through a riser 4 into a liquid line 5 which leads to a reaction vessel 6.

The reaction vessel 6 is lined with quartz and is surrounded by a metal block 7. On the reaction vessel 6, a contactless level sensor 8 is fitted. The sensor may be, for example, a photoelectric cell or a capacitive initiator which is connected via a control line 9, shown dotted in FIG. 1, with a valve 10 which is the actuator in the liquid line 5. Together with the valve 10, the level sensor 8 forms a simple two-point controller which serves to maintain a given level in the reaction vessel 6. In place of the layout shown, the valve 10 can also be fitted in the carrier gas line 1 leading to the stock vessel 2.

For keeping the temperature of the reaction vessel constant or altering it in a controller manner, a temperature control system is provided which, in the illustrative example shown, comprises Peltier elements 11 on the outside of the metal block 7.

To bring the liquid fed from the stock vessel 2 to the reaction vessel 6 up to the desired temperature, the liquid line 5 is connected to one or more passages 12, shown diagrammatically in the drawing, in the metal block 7, which passage(s) is or are connected to the feed line into the reaction vessel 6.

Through a gas line 13, branching off from the carrier gas line 1, a predetermined volumetric flow of carrier gas is fed via a volumetric flow control device 14, only indicated in FIG. 1, which may be, for example, a thermal mass flow controller, and a line 15 to the dip tube or fritted tube 16, which ends in the lowest region of the reaction vessel 6. From there, the carrier gas bubbles rise through the liquid contained in the reaction vessel 6 and are thus saturated. The gas mixture leaves the reaction vessel 6 through a mixture line 17.

The volume of the reaction vessel 6 is chosen to be as small as possible; however, it takes up at least 1.5 to 2 times the liquid volume required for each individual process charge. For example, the volume of the reaction vessel is in the range of 10-20 ml and the height/diameter ratio of the reaction vessel 6 is approximately in the range 4:1 to 8:1.

Figure 2:
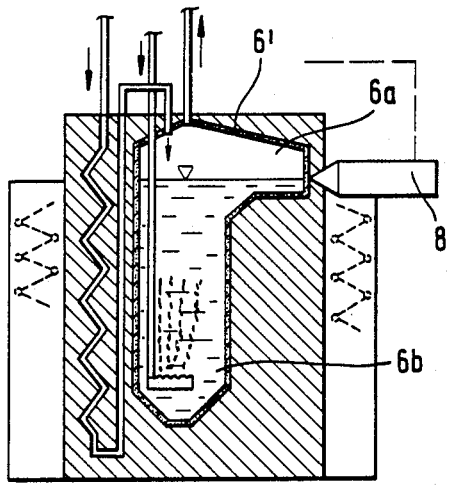
FIG. 2 shows a reaction vessel which has been modified as compared with the design according to FIG. 1, likewise as a vertical section.

In the embodiment shown in FIG. 2, the reaction vessel 6' differs from the embodiment according to FIG. 1 only in that the diameter or horizontal cross-sectional area of the reaction vessel 6' is substantially greater in its upper part 6a in the region of the level sensor than in its lower part 6b. The result is that the level changes arising with changes in the liquid volume in the reaction vessel 6' are very small.

From the foregoing description, one skilled in the art can easily ascertain the essential characteristics of this invention, and without departing from the spirit and scope thereof, can make various changes and modifications of the invention to adapt it to various usages and conditions.

The entire text of all applications, patents and publications, if any, cited above and below are hereby incorporated by reference.

What is claimed is:

1. A device for producing a gas mixture with a liquid by saturation, the device having a stock vessel (2) for containing the liquid and a dip tube (16) for introducing a carrier gas into the liquid, wherein the stock vessel (2) is connected via a liquid line (5) to a separate reaction vessel (6) to which the carrier is fed via the dip tube (16), the reaction vessel having a volume substantially smaller than the volume of the stock vessel (2), the reaction vessel (6) having a contactless level sensor (8) which precisely controls a flow regulation instrument (10) in the liquid line (5) leading to the reaction vessel (6), and to maintain a substantially constant liquid level in the reaction vessel, a temperature control system (11) disposed in juxaposition with the reaction vessel, the temperature control system comprising a metal heat sink (7) completely surrounding and in direct contact with the reaction vessel (b) with Peltier elements in direct contact with the heat sink (7) so as to precisely control the temperature thereof.

2. The device according to claim 1, wherein the reaction vessel (6) is made of quartz and is disposed in a metal block (7) connected to the temperature control system (11).

3. The device according to claim 2, wherein the liquid line (5) coming from the flow regulation instrument (10) passes through at least one path (12) through the metal block (7) to the dip tube (16).

4. The device according claim 1, wherein the reaction vessel (6) has a height/diameter ratio approximately in the range from 4:1 to 8:1.

5. The device according to claim 1, wherein the flow regulation instrument in the liquid line (5) is designed as a two-point controller having a valve (10) which can be switched between a closed position and an open position.

6. The device according to claim 1, wherein the diameter of the reaction vessel (6') is substantially greater in its upper part (6a) in the region of the level sensor (8) than in its lower part (6b).

7. An apparatus for producing a gas mixture by saturating a carrier gas by passing the carrier gas through a liquid, the apparatus comprising:
 a feed line for conveying the carrier gas;
 a reaction vessel containing the liquid therein at a selected level; the reaction vessel having the feed line for conveying the carrier gas opening therein at a level below the selected level of the liquid, wherein the carrier gas passes through the liquid to produce the gas mixture which passes through an outlet in the reaction vessel;
 a supply vessel having a volume substantially greater than the reaction vessel; being separate from the reaction vessel, and being connected thereto by a liquid supply line;

means for sensing the level of liquid in the reaction vessel and for generating a signal indicating that the level of liquid has dropped below the selected level so as to continuously maintain the liquid at the selected level;

means connected to the sensing means for causing liquid in the supply vessel to flow through the liquid supply line to the reaction vessel upon generation of a signal by the sensing means; and a temperature control system comprising a metal heat sink completely surrounding and in direct contact with the reaction vessel, the heat sink having Peltier elements in direct contact therewith so as to precisely control the temperature of the reaction vessel.

8. The apparatus of claim 7, further including heating means associated with the liquid supply line for heating the liquid before the liquid passes into the reaction vessel.

9. The apparatus of claim 7, wherein the reaction vessel is lined with quartz.

10. The apparatus of claim 7, wherein the means for causing liquid to flow includes a pressure line connecting the carrier gas line to the supply vessel for pressurizing the supply vessel in order to force the liquid to flow from the supply vessel to the reaction vessel.

11. The apparatus of claim 7, wherein the sensing means includes a contactless sensor disposed in proximity with the reaction vessel and aligned with the selected level therein.

12. The apparatus of claim 11, wherein there is a single contactless sensor disposed in proximity with the reaction vessel to insure that the gas bubbles through the liquid over a path of constant length.

13. The apparatus of claim 7, wherein there is a single reaction vessel.

14. The apparatus of claim 7, wherein the reaction vessel includes a lower portion and an upper portion, the upper portion having a relatively large horizontal cross-sectional area as compared to that of the lower portion wherein changes in liquid level in the reaction chamber as a result of changes in volume are relatively small, there being a single contactless sensor aligned with a selected desired level of the top surface of the liquid in the upper portion.

* * * * *